US010109690B2

(12) United States Patent
Hosono et al.

(10) Patent No.: US 10,109,690 B2
(45) Date of Patent: Oct. 23, 2018

(54) ORGANIC LIGHT-EMITTING PANEL AND ORGANIC LIGHT-EMITTING DEVICE WITH OPTIMIZED BANK PROFILE

(71) Applicant: JOLED INC., Tokyo (JP)

(72) Inventors: Nobuto Hosono, Tokyo (JP); Tsuyoshi Yamamoto, Osaka (JP)

(73) Assignee: JOLED INC., Tokyo (JP)

(*) Notice: Subject to any disclaimer, the term of this patent is extended or adjusted under 35 U.S.C. 154(b) by 0 days.

(21) Appl. No.: 15/127,340

(22) PCT Filed: Mar. 10, 2015

(86) PCT No.: PCT/JP2015/001282

§ 371 (c)(1),
(2) Date: Sep. 19, 2016

(87) PCT Pub. No.: WO2015/141176

PCT Pub. Date: Sep. 24, 2015

(65) Prior Publication Data

US 2017/0133442 A1 May 11, 2017

(30) Foreign Application Priority Data

Mar. 20, 2014 (JP) ................................ 2014-058090

(51) Int. Cl.

*H01L 27/32* (2006.01)
*H01L 51/00* (2006.01)
*H01L 51/50* (2006.01)

(52) U.S. Cl.

CPC ...... *H01L 27/3246* (2013.01); *H01L 27/3258* (2013.01); *H01L 51/0005* (2013.01); *H01L 51/5012* (2013.01); *H01L 2227/323* (2013.01)

(58) Field of Classification Search

CPC ............. H01L 27/3246; H01L 27/3258; H01L 2227/323; H01L 51/5012; H01L 51/0005

See application file for complete search history.

(56) References Cited

U.S. PATENT DOCUMENTS 5,443,922 A 8/1995 Nishizaki et al.
2003/0189210 A1 10/2003 Yamazaki et al.
(Continued)

FOREIGN PATENT DOCUMENTS

JP H05-163488 A 6/1993
JP 2003-302917 A 10/2003
(Continued)

OTHER PUBLICATIONS

International Search Report and Written Opinion issued in International Patent Application No. PCT/JP2015/001282, dated May 12, 2015; with partial English translation.

*Primary Examiner* — Mamadou Diallo
(74) *Attorney, Agent, or Firm* — McDermott Will & Emery LLP

(57) ABSTRACT

An object is to provide an organic light-emitting panel and an organic light-emitting device capable of reducing ink repellence at portions of banks intersecting an insulating layer. Light-emitting units of the organic light-emitting panel are separated by the insulating layer and the banks. The insulating layer is disposed between first electrode units that are adjacent in a first direction, and the banks are disposed between first electrode units that are adjacent in a second direction. Portions of the banks that intersect with the insulating layer extend over the insulating layer in the first direction. Each of the portions of the banks over the insulating layer, in lateral cross-section, have a surface where an inclination angle θ1 and an inclination angle θ2 between the surface and a surface of the insulating layer satisfy θ1>20° and θ2>20°.

8 Claims, 10 Drawing Sheets

(56) References Cited

U.S. PATENT DOCUMENTS

| | | | | |
|---|---|---|---|---|
| 2006/0082300 | A1* | 4/2006 | Yamazaki | H01L 27/3246 313/512 |
| 2011/0198623 | A1 | 8/2011 | Matsushima | |
| 2013/0234126 | A1* | 9/2013 | Nakatani | H01L 27/3246 257/40 |
| 2013/0285034 | A1* | 10/2013 | Akamatsu | H05B 33/22 257/40 |
| 2014/0117336 | A1* | 5/2014 | Kim | H01L 51/5246 257/40 |
| 2014/0132487 | A1* | 5/2014 | Park | G02F 1/13454 345/55 |
| 2015/0303393 | A1* | 10/2015 | Dai | H01L 51/0004 257/40 |
| 2017/0213880 | A1* | 7/2017 | Nendai | H01L 27/3246 |

FOREIGN PATENT DOCUMENTS

| | | | | | |
|---|---|---|---|---|---|
| JP | 2005-044577 | A | | 2/2005 | |
| JP | 2011-066019 | A | | 3/2011 | |
| JP | 2013-89293 | A | * | 10/2011 | H05B 33/10 |
| JP | 2013-89293 | A | * | 5/2013 | |
| JP | 2013-089293 | A | | 5/2013 | |
| WO | 2011/077476 | A1 | | 6/2011 | |

* cited by examiner

Drive circuit
Drive circuit
Drive circuit
Drive circuit
Organic display panel
Control circuit
1
10
20
21
22
23
24
25
X
Y

ORGANIC LIGHT-EMITTING PANEL AND ORGANIC LIGHT-EMITTING DEVICE WITH OPTIMIZED BANK PROFILE

RELATED APPLICATIONS

This application is the U.S. National Phase under 35 U.S.C. § 371 of International Patent Application No. PCT/JP2015/001282, filed on Mar. 10, 2015, which in turn claims the benefit of Japanese Application No. 2014-058090, filed on Mar. 20, 2014, the disclosures of which Applications are incorporated by reference herein.

TECHNICAL FIELD

The present invention relates to an organic light-emitting panel and to an organic light-emitting device, and particularly to bank shape.

BACKGROUND ART

An organic light-emitting panel has a plurality of pixel units, each provided with an organic light-emitting layer between an anode electrode and a cathode electrode, arranged two-dimensionally over a substrate. Elongated banks (that is, "line banks") are provided between neighboring pixel regions in order to prevent mixing with ink of another neighboring pixel region when the organic light-emitting layer is formed by using a wet printing process using ink containing an organic material, for example, to form the organic light-emitting panel.

In this organic light-emitting panel, in addition to the banks, an insulating layer providing insulation between pixel regions is arranged between pixel regions that are adjacent to each other in an extension direction of the banks. Normally, as seen in a plan view, the banks are formed to extend over the insulating layer while being in contact with a top face of the insulating layer at a portion intersecting the insulating layer.

The banks are formed to be taller than the insulating layer, and the insulating layer is formed to be taller than a top face of the anode electrode (using a top face of the substrate for reference). Accordingly, once ink for the organic light-emitting layer has been applied between neighboring banks, it is continuous in the extension direction of the banks, crossing the insulating layer and covering the anode electrode, and the organic light-emitting layer may be obtained with comparatively little variation in thickness among the pixel units.

Patent Literature 1 proposes a technique of defining the lateral cross-sectional shape of the banks in order to improve the planarity of the organic light-emitting layer. Specifically, the cross-sectional shape of the banks has a main portion that is convex, and a tail potion having a downward-curving convex surface.

CITATION LIST

Patent Literature

[Patent Literature 1]
Japanese Patent Application Publication No. 2005-44577

SUMMARY OF INVENTION

Technical Problem

However, the above-described technique has been found, in certain cases, not to produce results for an organic light-emitting panel using a line bank scheme. In other words, for portions of the banks intersecting the insulating layer as seen in a plan view, although the profile of the banks over the insulating layer is downward-curving and convex, the ink has been found to be repelled by the surface of the tail portion of the bank. Notably, ink repellency increases variation in light emission for the pixel units on both sides of the insulating layer.

Here, ink repellency occurs not only when applying the ink for the organic light-emitting layer, but also occurs similarly when applying ink containing material for functional layers having other functions onto the surface of the insulating layer.

The present invention aims to provide an organic light-emitting panel and an organic light-emitting device capable of reducing ink repellency during organic light-emitting layer formation at portions of the banks intersecting the insulating layer.

Solution to Problem

An organic light-emitting panel pertaining to one aspect of the present invention is an organic light-emitting panel including: a substrate; a plurality of first electrode units arranged at intervals along a first direction and a second direction over a main surface of the substrate; an insulating layer extending in the second direction between adjacent ones of the first electrode units in the first direction over the substrate; a plurality of banks each extending in the first direction between adjacent ones of the first electrode units in the second direction over the substrate, the banks crossing over the insulating layer while being in contact with the insulating layer at portions intersecting the insulating layer, and being taller than the insulating layer and the first electrode units; a light-emitting unit disposed between adjacent ones of the banks, being continuous in the first direction and crossing over the insulating layer, and including an organic light-emitting layer made from an organic material; and a second electrode unit disposed at least above the first electrode units, in a region corresponding to the light emitting unit, wherein the insulating layer, the banks, and a bottom-most layer portion of the light-emitting unit are each made from an organic material, for each of the first electrode units, at least a top face portion thereof is made from one of a metal material and an inorganic material, for each of the banks, a portion thereof that is positioned over the insulating layer, in a cross-section orthogonal to the first direction, has a surface where an inclination angle $\theta\mathbf{1}$ and an inclination angle $\theta\mathbf{2}$, defined below, satisfy the relations:

$$\theta 1>20° \text{ and } \theta 2>20°.$$

Here, the inclination angle $\theta\mathbf{2}$ is an angle between a first virtual line joining a first point and a second point, and a top face of the insulating layer, the inclination angle $\theta\mathbf{1}$ is an angle between a second virtual line joining the second point and a third point, and the top face of the insulating layer, the first point being on the surface of the bank at 75% of total height of the bank relative to the top face of the insulating layer, the second point being on the surface of the bank at 20% of total height of the bank relative to the top face of the insulating layer, and the third point being on the surface of the bank at 0% of total height of the bank relative to the top face of the insulating layer.

Advantageous Effects of Invention

The organic light-emitting panel pertaining to the above-described aspect is capable of reducing ink repellency in organic light-emitting layer formation, by defining an inclination angle of the banks over the insulating layer within a predetermined range.

DESCRIPTION OF EMBODIMENTS

Aspects of the Invention

Figure 1:
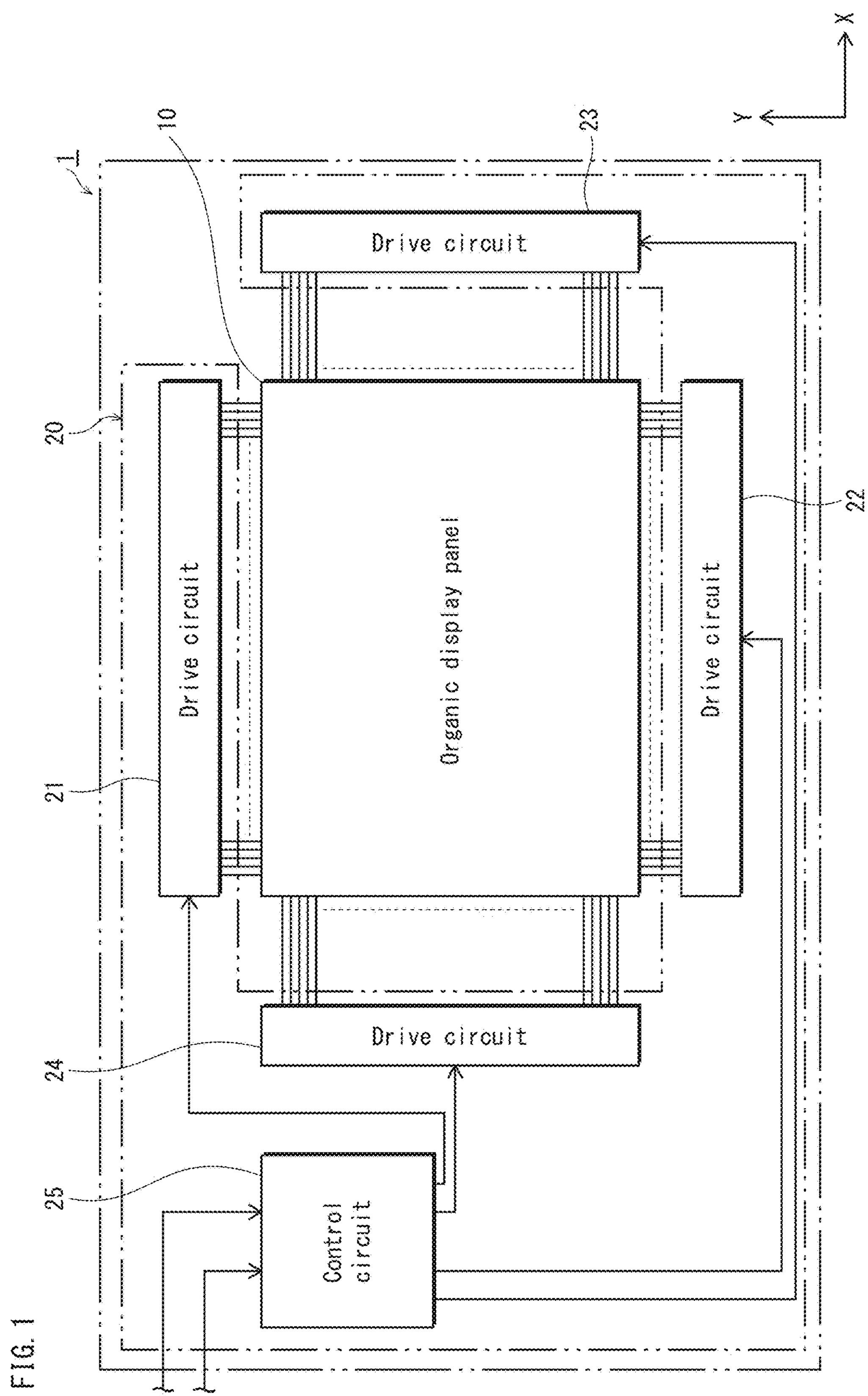
FIG. 1 is a schematic block diagram indicating the overall configuration of an organic display device pertaining to an embodiment.

An organic light-emitting panel pertaining to one aspect of the present invention is an organic light-emitting panel including: a substrate; a plurality of first electrode units arranged at intervals along a first direction and a second direction over a main surface of the substrate; an insulating layer extending in the second direction between adjacent ones of the first electrode units in the first direction over the substrate; a plurality of banks each extending in the first direction between adjacent ones of the first electrode units in the second direction over the substrate, the banks crossing over the insulating layer while being in contact with the insulating layer at portions intersecting the insulating layer, and being taller than the insulating layer and the first electrode units; a light-emitting unit disposed between adjacent ones of the banks, being continuous in the first direction and crossing over the insulating layer, and including an organic light-emitting layer made from an organic material; and a second electrode unit disposed at least above the first electrode units, in a region corresponding to the light emitting unit, wherein the insulating layer, the banks, and a bottom-most layer portion of the light-emitting unit are each made from an organic material, for each of the first electrode units, at least a top face portion thereof is made from one of a metal material and an inorganic material, for each of the banks, a portion thereof that is positioned over the insulating layer, in a cross-section orthogonal to the first direction, has a surface where an inclination angle $\theta 1$ and an inclination angle $\theta 2$, defined below, satisfy the relations:

$$\theta 1>20° \text{ and } \theta 2>20°.$$

Here, the inclination angle $\theta 2$ is an angle between a first virtual line joining a first point and a second point, and a top face of the insulating layer, the inclination angle $\theta 1$ is an angle between a second virtual line joining the second point and a third point, and the top face of the insulating layer, the first point being on the surface of the bank at 75% of total height of the bank relative to the top face of the insulating layer, the second point being on the surface of the bank at 20% of total height of the bank relative to the top face of the insulating layer, and the third point being on the surface of the bank at 0% of total height of the bank relative to the top face of the insulating layer.

Further, the banks are made from a fluorine resin material. Accordingly, lyophobic performance may be preserved. Further, the inclination angle $\theta 1$ and the inclination angle $\theta 2$ satisfy the relation $\theta 2>\theta 1$. Accordingly, ink repellency may be substantially reduced during organic light-emitting layer formation.

Further, in the cross-section of the portion of the bank positioned over the insulating layer, a profile from the first point to the second point includes an upwardly convex curved portion, and a profile from the second point to the third point includes a downwardly convex curved portion. Accordingly, ink repellency may be substantially reduced during organic light-emitting layer formation.

An organic light-emitting device pertaining to an aspect of the present invention is an organic light-emitting device including: an organic light-emitting panel; and a control drive circuit connected to the organic light-emitting panel, wherein the organic light-emitting panel described above is used as the organic light-emitting panel.

Embodiment

An organic display device having an organic display panel with plurality of emission colors, emitting combined light combining the emission colors, and displaying an image (information) is described as an example of an organic light-emitting device. An organic display device 1 pertaining to the embodiment is described below with reference to the accompanying drawings.

1. Overall Configuration

The overall configuration of the organic display device 1 pertaining to the present embodiment is described with reference to FIGS. 1 and 2.

FIG. 1 is a schematic block diagram indicating the overall configuration of the organic display device 1 pertaining to the embodiment. FIG. 2 is a schematic plan view diagram indicating an arrangement of sub-pixels 10*a*, 10*b*, and 10*c* for an organic display panel 10.

As indicated in FIG. 1, the organic display device 1 includes the organic display panel 10 and a drive/control unit 20. The organic display panel 10 is an organic EL panel that utilizes electroluminescence of organic material.

Figure 2:
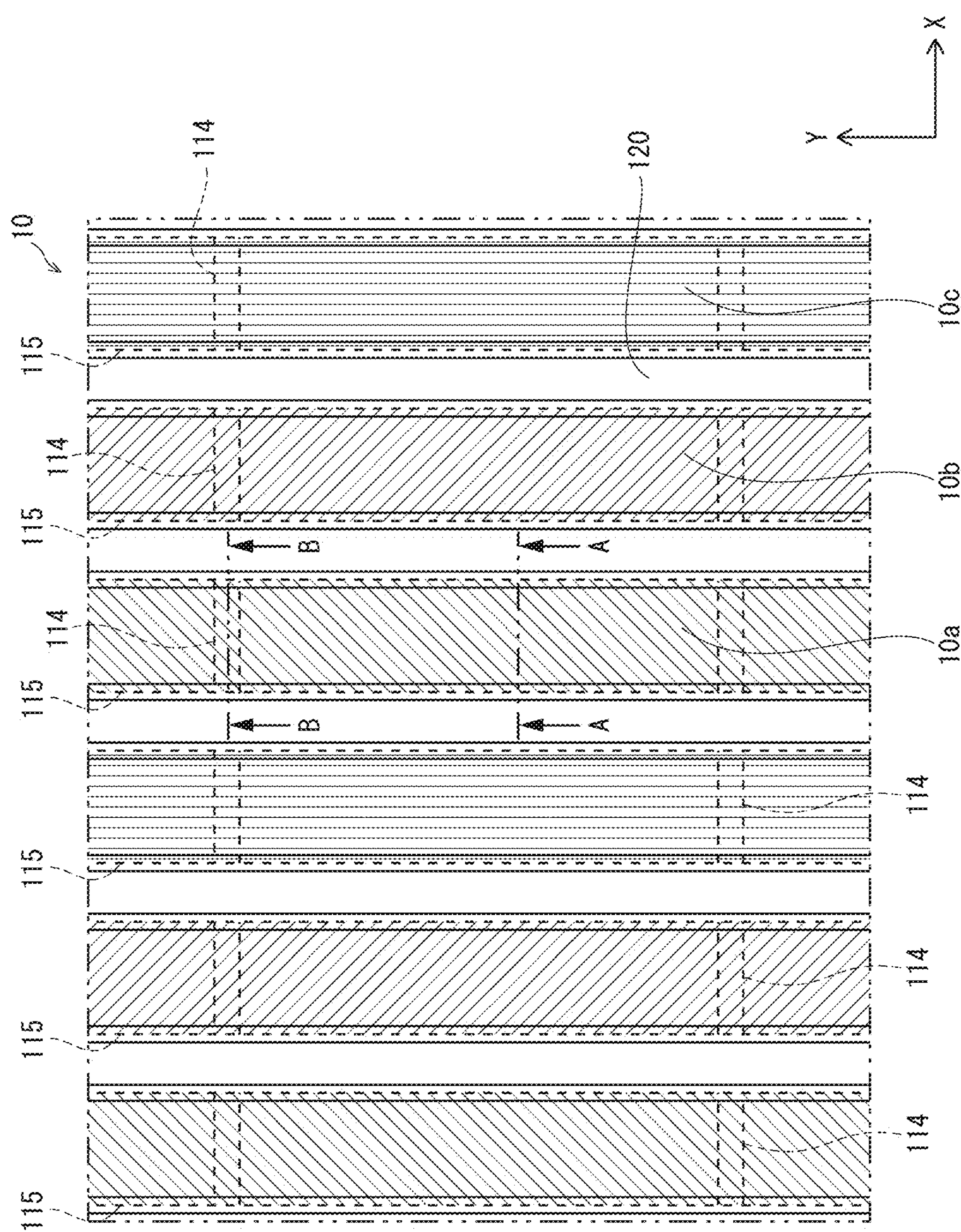
FIG. 2 is a schematic plan view diagram indicating a sub-pixel arrangement format for an organic display panel.

As indicated in FIG. 2, the plurality of sub-pixels (sub-pixel units) 10*a*, 10*b*, and 10*c* are arranged two-dimensionally in the X-axis direction (an example of the "second direction" of the present invention) and the Y-axis direction (the "first direction" of the present invention). In the present embodiment, for example, sub-pixels 10*a* emit red light (R), sub-pixels 10*b* emit green light (G), and sub-pixels 10*c* emit blue light (B).

Also, a single pixel (pixel unit) is configured as a display function by combining three of the sub-pixels 10*a*, 10*b*, and 10*c* neighboring each other in the X-axis direction. However, in structural terms, each unit including an anode, an organic light-emitting layer, and a cathode, that is, each sub-pixel, is one pixel unit.

Here, the organic display panel 10 includes a first bank (the "banks" of the present invention) 115. As illustrated in FIG. 2, the organic light-emitting layer is formed in a continuous shape along line banks 115 (although the organic light-emitting layer is not normally visible in the plan view depicted in FIG. 2, hatching is provided in order to illustrate the continuous shape along the line banks 115). Therefore, a second bank (an example of the "insulating layer" of the present invention) 114 indicating the border of the sub-pixels 10*a*, 10*b*, and 10*c* is depicted as a dashed line.

Returning to FIG. 1, the drive/control unit 20 in the organic display device 1 includes four drive circuits 21, 22, 23, 24 and a control circuit 25. The positional relationship between the organic display panel 10 and the drive/control unit 20 in the organic display device 1 is not limited to the form illustrated in FIG. 1.

Further, pixel configuration in relation to display function is not limited to the combination of three sub-pixels 10*a*, 10*b*, 10*c* shown in FIG. 2. One pixel may include a combination of four or more sub-pixels.

2. Configuration of the Organic Display Panel 10

Figure 3:
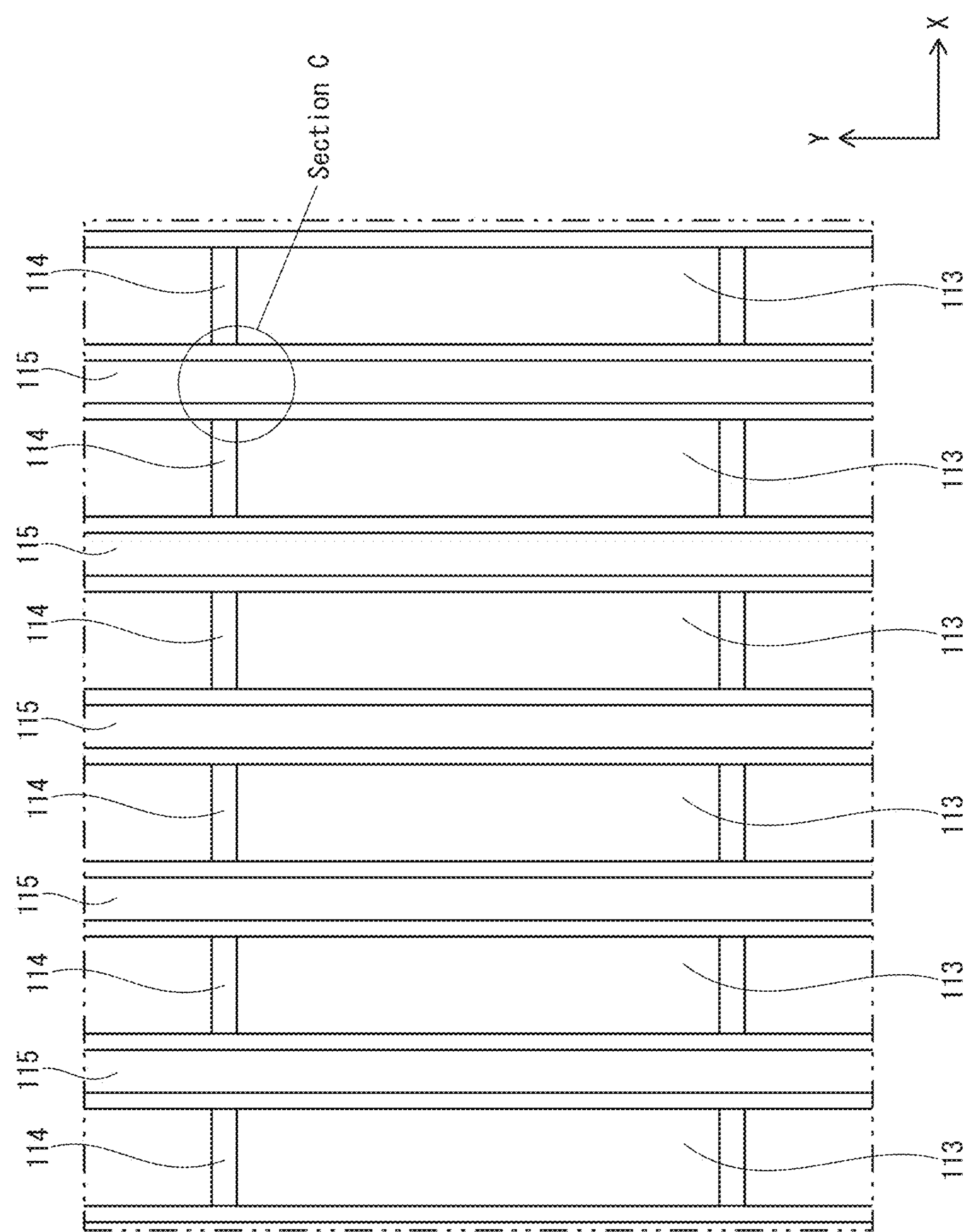
FIG. 3 is a schematic plan view diagram indicating the exposure of a second bank in the organic display panel.

FIG. 3 is a schematic plan view diagram indicating the exposure of the second bank 114 in the organic display panel 10.

As indicated in FIG. 2, the sub-pixels 10*a*, 10*b*, and 10*c* are arranged two-dimensionally over a substrate (not illustrated) of the organic display panel 10. As indicated in FIG. 3, sub-pixel regions in which the sub-pixels 10*a*, 10*b*, and 10*c* are formed are regions partitioned into rectangles by the second bank 114 extending in the X-axis direction and the first bank 115 extending in the Y-axis direction. Notably, the sub-pixels 10*a*, 10*b*, and 10*c* may have structures enabling light emission, and the sub-pixel regions may be regions where the sub-pixels 10*a*, 10*b*, and 10*c* are formed and regions where formation is planned.

Figure 4:
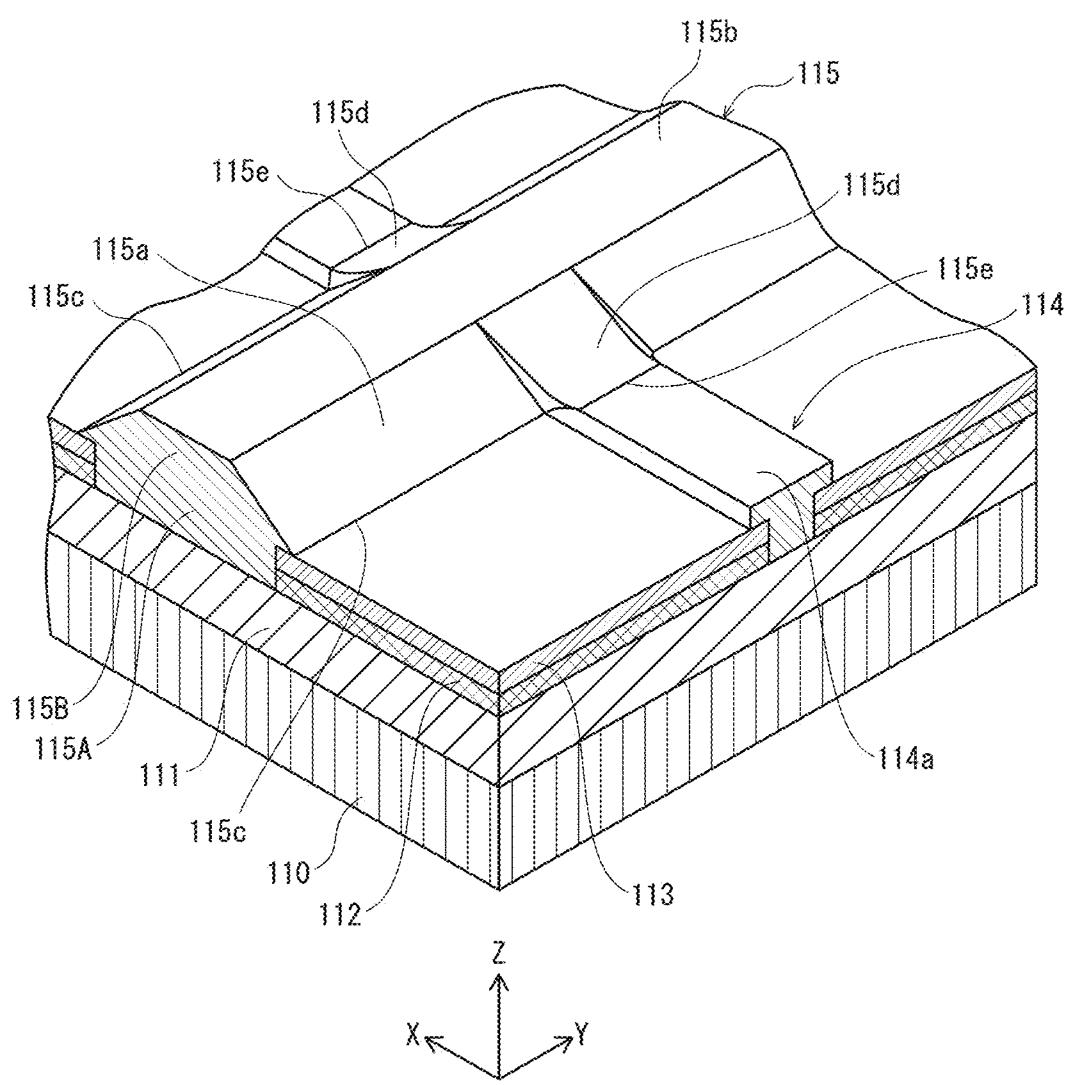
FIG. 4 is a perspective view diagram indicating a portion of a first bank not intersecting the second bank in section C of FIG. 3.
Figure 5:
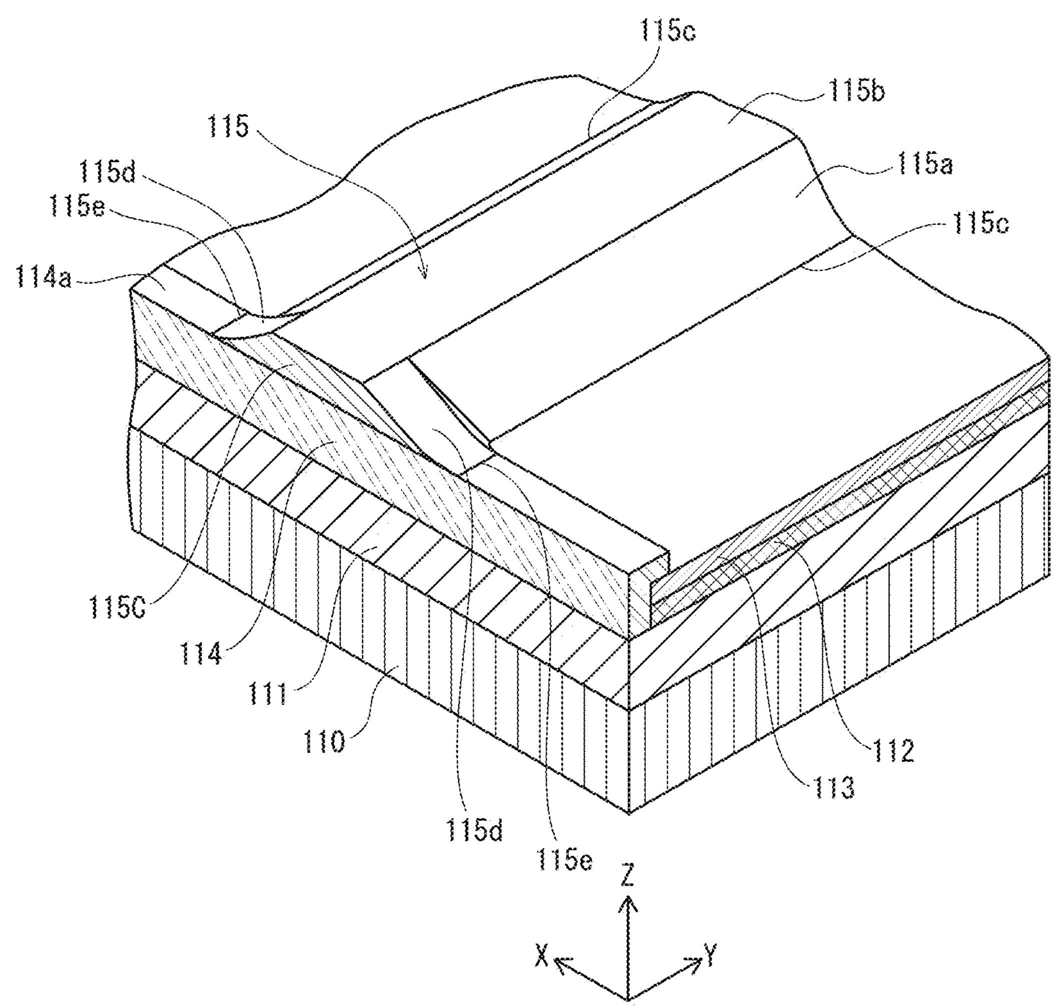
FIG. 5 is a perspective view diagram indicating a portion of the first bank intersecting the second bank in section C of FIG. 3.
Figure 6:
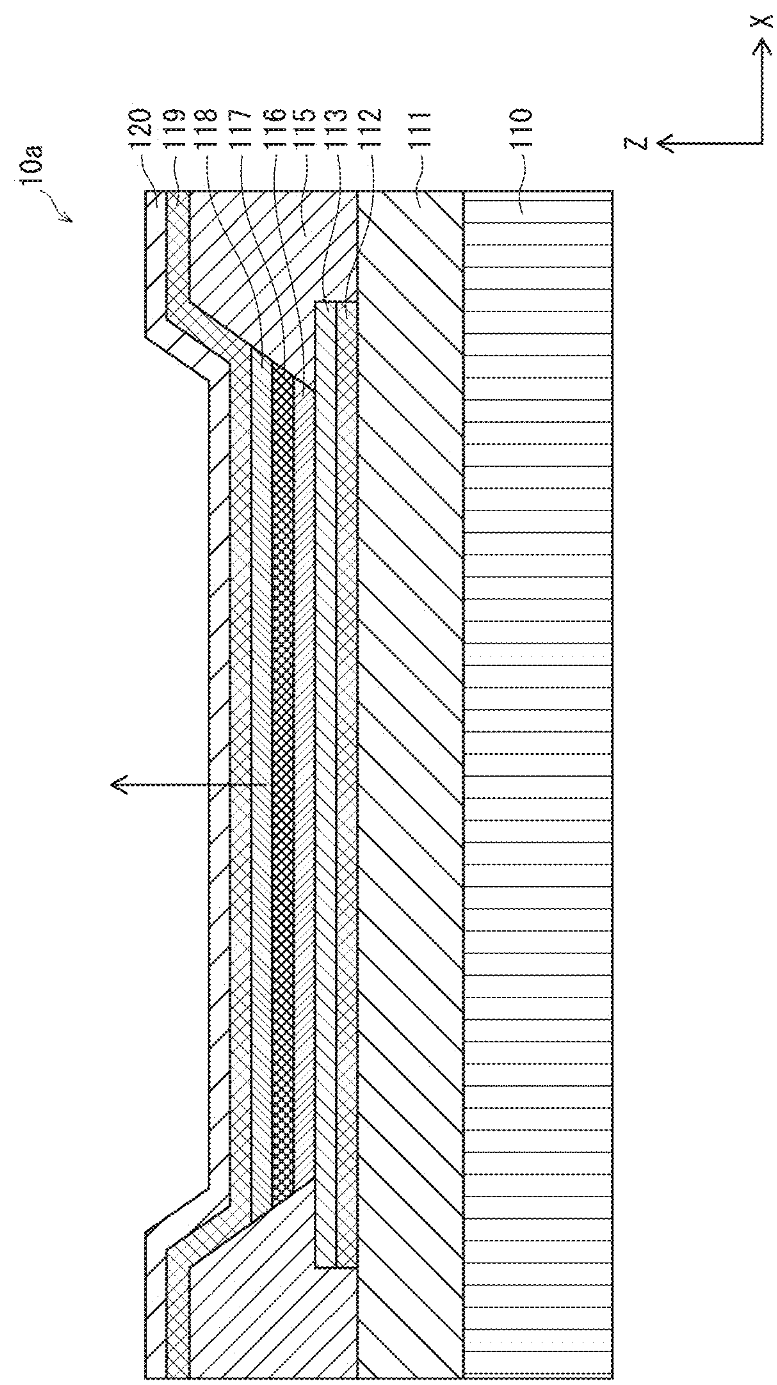
FIG. 6 is a schematic cross-sectional diagram indicating the structure of a cross-section along A-A in FIG. 2.
Figure 7:
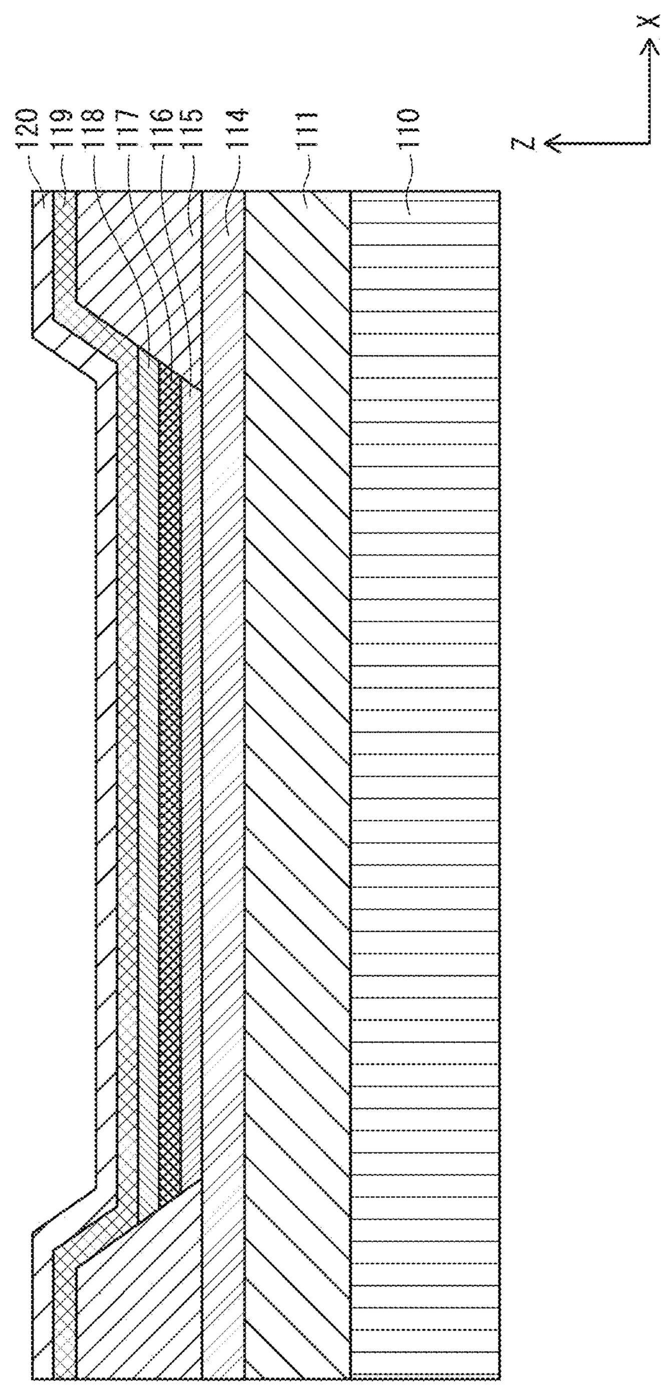
FIG. 7 is a schematic cross-sectional diagram indicating the structure of a cross-section along B-B in FIG. 2.

FIG. 4 is a perspective view diagram indicating a portion of section C of FIG. 3 where the second bank 114 does not intersect the first bank 115. FIG. 5 is a perspective view diagram of a portion of section C of FIG. 3 where the second bank 114 intersects the first bank 115. FIG. 6 is a schematic cross-sectional diagram indicating the structure of a cross-section A-A in FIG. 2. FIG. 7 is a schematic cross-sectional diagram indicating the structure of a cross-section B-B in FIG. 2.

The sub-pixels 10*a*, 10*b*, and 10*c* share an identical basic configuration. Sub-pixel 10*a* is described with primary reference to FIG. 6. Sub-pixel 10*a* is mainly provided with an anode 112, an organic light-emitting layer 117, and a cathode 119.

A more specific explanation follows.

The organic display panel 10 has a TFT substrate 110 as a base, and an inter-layer insulating layer 111 stacked thereon. Here, the inter-layer insulating layer 111 is termed as such in order to distinguish it from the "insulating layer" of the present invention.

The inter-layer insulating layer 111 has a top face in the Z-axis direction formed so as to be substantially planar. Notably, the TFT layer and other components of the TFT substrate 110 are omitted from depiction for simplicity.

The anode 112 and a hole injection layer 113 are formed and stacked in the stated order in the sub-pixel regions on the top face of the inter-layer insulating layer 111 in the Z-axis direction. Here, the anode 112 is an example of the "first electrode" pertaining to the present invention. Likewise, the stack of the anode 112 and the hole injection layer 113 is an example of the "first electrode unit" of the present invention. Here, the hole injection layer 113 is an example of the "top face portion of the first electrode unit" of the present invention.

Next, as indicated in FIG. 4 and FIG. 5, the first bank 115 is formed so as to cover the inter-layer insulating layer 111 and both edges of the hole injection layer 113 in the X-axis direction. Also, the second bank (an example of the "insulating layer" of the present invention) 114 is formed so as to cover the inter-layer insulating layer 111 and both edges of the hole injection layer 113 in the Y-axis direction.

As indicated in FIG. 6, a hole transport layer 116, an organic light-emitting layer 117, and an electron transport layer 118 are formed and stacked in the stated order, starting from the bottom in the Z-axis direction, between two of the first bank 115 neighboring each other in the X-axis direction. The hole transport layer 116, the organic light-emitting layer 117, and the electron transport layer 118 are formed crossing over the second bank 114 to be continuous in the Y-axis direction (see the hatched portion of FIG. 2.) The stack of the hole transport layer 116, the organic light-emitting layer 117, and the electron transport layer 118 is an example of the "light-emitting unit" of the present invention. The hole transport layer 116 is an example of the "bottom-most layer of the light-emitting unit" of the present invention.

A cathode 119 and a sealing layer 120 are formed in the stated order so as to cover the electron transport layer 118, and a side face top portion and a peak face of the first bank 115. Notably, the cathode 119 is an example of the "second electrode" of the present invention, and is also an example of the "second electrode unit" of the present invention.

The organic display panel 10 pertaining to the present embodiment is a top emission panel, emitting light upward in the Z-axis direction as indicated by the arrow in FIG. 6.

Regions other than the sub-pixel regions (termed non-sub-pixel regions) are described, for example, in terms of the configuration between sub-pixel regions neighboring in the Y-axis direction, that is, the configuration of regions where the second bank 114 is present.

As indicated in FIG. 7, the inter-layer insulating layer 111 is stacked over the TFT substrate 110 in the non-sub-pixel regions. As per the sub-pixel regions, the top face of the inter-layer insulating layer 111 is formed so as to be substantially planar. As indicated in FIG. 5 and FIG. 7, the anode 112 and the hole injection layer 113 are not formed in the non-sub-pixel regions, while the second bank 114 is formed therein.

As indicated in FIG. 7, the hole transport layer 116, the organic light-emitting layer 117, and the electron transport layer 118 are formed and stacked in the stated order, starting from the bottom in the Z-axis direction, in any region of the top face of the second bank 114 in the Z-axis direction where the first bank 115 is not formed. Furthermore, the cathode 119 and the sealing layer 120 are formed in the stated order so as to cover the electron transport layer 118, as well as the side face top portion and peak face portion of the first bank 115 present over the second bank 114.

3. Component Materials of Organic Display Panel 10

(1) TFT Substrate 110

The TFT substrate 110 is made from a substrate and a TFT layer disposed on an upper surface of the substrate in the Z-axis direction. Although not illustrated, the TFT layer includes gate, source, and drain electrodes, a semiconductor layer, and a passivation layer.

The substrate that is a base of the TFT substrate 110 may be made from a glass substrate, a quartz substrate, a silicon substrate, a metal substrate such as molybdenum sulfide, copper, zinc, aluminium, stainless steel, magnesium, iron, nickel, gold, or silver, a semiconductor substrate such as gallium arsenide, or a plastic substrate.

As a plastic material, any thermoplastic or thermosetting resin may be used. For example, polyolefin such as polyethylene, polypropylene, ethylene-propylene copolymer, ethylene-vinyl acetate copolymer (EVA), cyclic polyolefin, modified polyolefin, polyvinyl chloride, polyvinylidene chloride, polystyrene, polyamide, polyimide (PI), polyamide-imide, polycarbonate, poly-(4-methyl-1-pentene), ionomer, acrylic resin, polymethyl methacrylate, styrene acrylonitrile copolymer (SAN), butadiene styrene copolymer, ethylene vinyl alcohol (EVOH), polyethylene terephthalate (PET), polybutylene terephthalate, polyethylene naphthalate (PEN), polyester such as polycyclohexylenedimethylene terephthalate (PCT), polyether, polyether ketone, polyether sulfone (PES), polyetherimide, polyacetal, polyphenylene oxide, modified polyphenylene oxide, polyarylate, aromatic polyester (liquid crystal polymer), polytetrafluoroethylene, polyvinylidene fluoride, other fluorine-based resins, various thermoplastic elastomers such as styrene-, polyolefin-, polyvinyl chloride-, polyurethane-, fluorine rubber-, or chlorinated polyethylene-based thermoplastic elastomers, epoxy resin, phenol resin, urea resin, melamine resin, unsaturated polyester, silicone resin, polyurethane, or a copolymer, blend, polymer alloy, etc., primarily consisting of one of the above, or a layered body including layers of one or more of the above can be used.

(2) Inter-layer Insulating Layer 111

The inter-layer insulating layer 111 is formed from an organic compound such as polyimide, polyamide, or an acrylic-based resin. The inter-layer insulating layer 111 preferably has organic solvent resistance.

Further, the inter-layer insulating layer 111 is subjected to etching processing and baking processing during the production process, and is therefore preferably formed by using a material that has a high resistance to deformation and alteration during such processing.

(3) Anode 112

The anode 112 is made from a metal material including silver (Ag) or aluminium (Al). In the case of the organic display panel 10 pertaining to the present embodiment, which is a top-emission type, surfaces of the anode 112 are preferably highly reflective.

The anode 112 is not necessarily a single layer structure made from a metal material as described above, and a layered body including a metal layer and a light-transmissive electrically-conductive layer may be used. As a light-transmissive electrically-conductive material, indium tin oxide (ITO) or indium zinc oxide (IZO) may be used, for example.

(4) Hole Injection Layer 113

The hole injection layer 113 is a layer made from, for example, an oxide of silver (Ag), molybdenum (Mo), chromium (Cr), vanadium (V), tungsten (W), nickel (Ni), or iridium (Ir), or an electrically conductive polymer such as poly(3,4-ethylenedioxythiophene) polystyrene sulfonate (PEDOT:PSS).

When a metal oxide is used as a material of the hole injection layer 113, in comparison to when an electrically conductive polymer such as PEDOT is used, the hole injection layer 113 has functions of assisting in stabilizing and generating holes to inject holes into the organic light-emitting layer 117, and has a large work function.

In a case of the hole injection layer 113 being made from a transition metal oxide, a plurality of energy levels can be obtained from a plurality of valences, and as a result hole injection becomes easier and drive voltage can be decreased. In particular, use of tungsten oxide ($WO_X$) is preferable with respect to the functions of stable hole injection and assisting in hole generation.

(5) Second Bank 114

The second bank 114 is formed from an organic material such as a resin and has insulating properties. As examples of organic materials that may be used in forming the second bank 122, acrylic-based resin, polyimide-based resin, or novalac-type phenolic resin may be used.

(6) First Bank 115

The first bank 115 is formed from an organic material such as a resin and has insulating properties. An organic material used in forming the first bank 115 may be the same as or may be different from the material used in forming the second bank 114. However, in the case of the hole transport layer 116, the organic light-emitting layer 117, etc., being formed by a wet printing process, the first bank 115 is preferably made from an organic material that is lyophobic with respect to ink. More specifically, when the second bank 114 is formed by an acrylic resin, polyimide resin, or novalac-type phenolic resin, a fluorine resin is preferably used as a material of the first bank 115.

Further, structure of the first bank 115 is not limited to the single-layer structure illustrated in FIG. 4 and FIG. 6, and may be a multi-layered structure having two or more layers. In this case, the materials described above may be combined in the layers.

(7) Hole Transport Layer 116

The hole transport layer 116 is made by using a polymer compound having no hydrophilic group. For example, a high molecular compound that does not have a hydrophilic group may be used, such as polyfluorene, a derivative thereof, poly arylamine, or a derivative thereof.

(8) Organic Light-Emitting Layer 117

The organic light-emitting layer 117 has a function of emitting light generated by an excited state due to recombination of holes and electrons injected thereto. A material used in forming the organic light-emitting layer 117 is an organic material that can form a thin film by use of a wet printing process, and has a light-emitting property.

For example, as disclosed in JP H5-163488, a phosphorescent material is preferably used, such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, cyanine compound, acridine compound, metal complex of an 8-hydroxyquinoline compound, metal complex of a 2-bipyridine compound, complex of a Schiff base and a group III metal, metal complex of oxine, fluorescent substance of a rare earth complex, or similar.

(9) Electron Transport Layer 118

The electron transport layer 118 has a function of transporting electrons injected from the cathode 119 to the organic light-emitting layer 117, and is formed using, for example, an oxadiazole derivative (OXD), a triazole derivative (TAZ), or a phenanthroline derivative (BCP, Bphen).

(10) Cathode 119

The cathode 119 may be formed from indium tin oxide (ITO) or indium zinc oxide (IZO), for example. In the case of the top-emission type of the organic display panel 10 pertaining to the present embodiment, the cathode 119 needs to be formed from a light-transmissive material.

(11) Sealing Layer 120

The sealing layer 120 has a function of suppressing exposure of organic layers such as the light-emitting layer 117 to moisture and air, and may be formed from a material such as silicon nitride (SiN) or silicon oxynitride (SiON). Further, on a layer formed from a material such as silicon nitride (SiN) or silicon oxynitride (SiON), a sealing resin layer composed of resin material such as acrylic resin or silicone resin may be provided.

In the case of the top-emission type of the organic display panel 10 pertaining to the present embodiment, the sealing layer 120 needs to be formed from a light-transmissive material.

4. First Bank 114 and Second Bank 115

(1) Formation (1-1) Second Bank 114

The second bank 114 is formed by uniformly applying an organic material configuring the second bank 114 over the hole injection layer 113 so as to fill between sub-pixel regions using, for example, a spin coating method. Here, the organic material is a photosensitive photoresist material.

Afterwards, optical exposure is performed on the applied organic material using a mask patterned (to cover only the periphery) so as to leave the organic material at the periphery of the hole injection layer 113 in the Y-axis direction. Then, any excess uncured organic material is removed with a developing fluid. Thus, the second bank 114 is formed in a shape having a lateral cross-section resembling a T, as depicted in FIG. 4, for example.

(1-2) First Bank 115

The first bank 115 is formed by uniformly applying an organic material (e.g., a fluorine resin) configuring the first bank 115 over the hole injection layer 113 and the second bank 114 so as to fill between sub-pixel regions neighboring each other in the X-axis direction and further cover the second bank 114, using the spin coating method or similar. Here, the organic material (e.g., the fluorine resin) is also a photosensitive photoresist material.

Afterwards, optical exposure is performed on the applied organic material using a mask patterned (to cover only the periphery) so as to leave the organic material at the periphery of the hole injection layer 113 in the X-axis direction. Subsequently, any excess uncured organic material is removed with a developing fluid. Thus, the first bank 115 is formed in a shape having a lateral cross-section with the overall shape of a T, and with a trapezoidal portion extending laterally, as indicated in FIG. 4 and FIG. 6, for example.

(2) Profile of the First Bank (2-1) Portion not Intersecting the Second Bank

The portion of the first bank 115 not intersecting the second bank 114 includes a base portion 115A, positioned between adjacent ones of the anode 112 in the X-axis direction and between adjacent ones of the hole injection layer 113 in the X-axis direction, and a protruding portion 115B protruding upward from the base portion 115A, as indicated in FIG. 4. The overall lateral cross-sectional shape of the base portion 115A is rectangular. Given the top face of the hole injection layer 113 in the Z-axis direction as a reference, the protruding portion 115B is a portion positioned above the reference.

Figure 8:
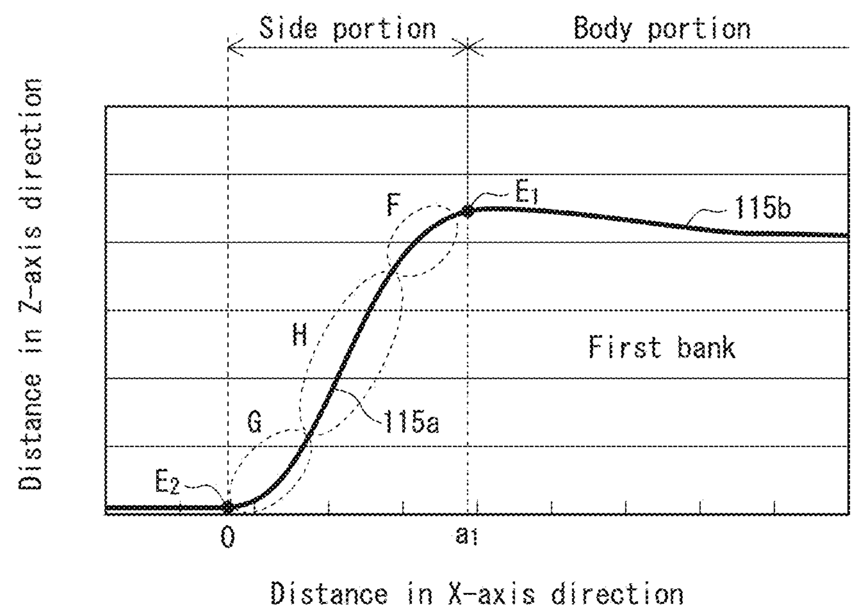
FIG. 8 is a diagram describing the profile of a portion of the first bank not intersecting the second bank.

FIG. 8 is a diagram describing the profile of a portion of the first bank 115 not intersecting the second bank 114. Here, FIG. 8 indicates one end side of the first bank 115 in the X-axis direction.

As indicated in FIG. 4 and FIG. 6, the overall lateral cross-sectional shape of the protruding portion 115B is trapezoidal; having a top base that is shorter than a bottom base. Here, as indicated in FIG. 8, a portion of the trapezoid that is substantially rectangular is a body portion, and portions substantially shaped as right-angle triangles on both sides of the body portion are side portions. As indicated in FIG. 4 and FIG. 5, the side portions have inclined edges each forming a side face 115*a* of the first bank 115.

A bottom edge of the protruding portion 115B is positioned over the periphery of the hole injection layer 113 in the X-axis direction, and the side face 115*a* of the protruding portion 115B is inclined in a downward curve.

In more accurate terms, as indicated in FIG. 8, the lateral cross-sectional shape of the protruding portion 115B rises upward from one peripheral edge of the top base (corresponding to the peak face of the first bank 115) 115*b* in the X-axis direction configuring the trapezoidal shape (a maximum point being at "E1"), then subsequently curves downward, being inclined toward (the periphery of) the hole injection layer 113.

Here, a region of the side face 115*a* is a range having a top edge at point E1 and a bottom edge at a point where the protruding portion 115B has a thickness of zero (minimum point "E2", labeled "115*c*" in FIG. 4 and FIG. 5).

The side face 115*a* is curved in an arc at a portion near a top edge (hereinafter, "top edge portion") F and a portion near a bottom edge (hereinafter, "bottom edge portion") G, and is nearly linear at an intermediate portion H between the top edge portion F and the bottom edge portion G.

The top edge portion F of the side face 115*a* has a curved (parabolic) shape that is upwardly convex. The bottom edge portion G of the side face 115*a* has a curved (parabolic) shape that is downwardly convex. An inflection point is found on the intermediate portion H. Notably, the length from point E2 to point E1, point E2 being a reference point in the X-axis direction, is a tail size, here labeled "a1".

(2-2) Portions intersecting the Second Bank

As indicated in FIG. 5, the portion of the first bank 115 intersecting the second bank 114 has a bottom face in contact with a top face 114*a* of the second bank 114, and a protruding portion 115C protruding upward. As indicated in FIG. 5, the overall lateral cross-sectional shape of the protruding portion 115C is trapezoidal; having a top base that is shorter than a bottom base.

Figure 9:
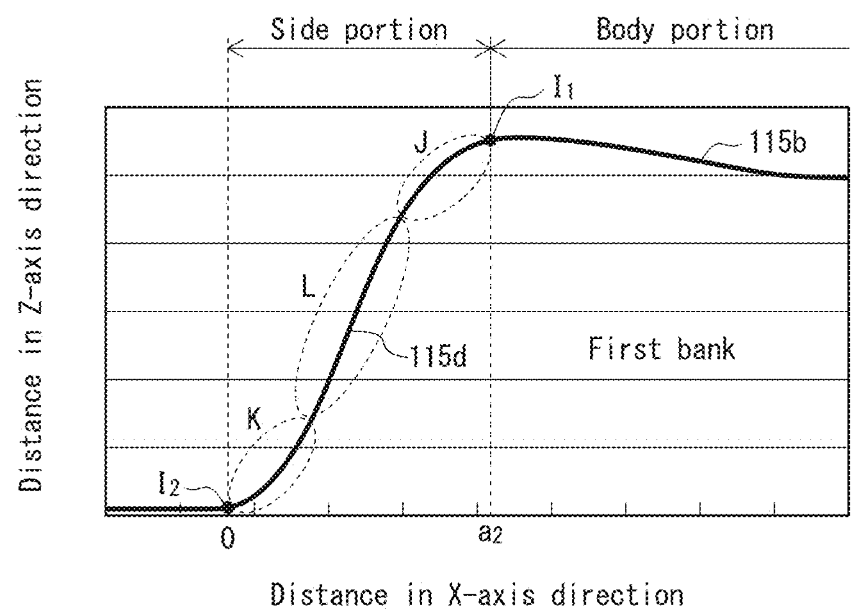
FIG. 9 is a diagram describing the profile of a portion of the first bank intersecting the second bank.

FIG. 9 is a diagram describing the profile of a portion of the first bank 115 intersecting the second bank 114. Here, FIG. 9 indicates one end side of the first bank 115 in the X-axis direction.

Here, as indicated in FIG. 9, a portion of the trapezoid that is rectangular is the body portion, and portions shaped as right-angle triangles on both sides of the body portion are the side portions. As indicated in FIG. 4 and FIG. 5, the side portions have inclined edges each forming a side face 115*d* of the first bank 115.

In more accurate terms, as indicated in FIG. 9, the lateral cross-sectional shape of the protruding portion 115C rises upward from one peripheral edge of the top base (corresponding to the peak face of the first bank 115) 115*b* in the X-axis direction configuring the trapezoidal shape (a maximum point being at "I1"), then subsequently curves downward, being inclined toward the second bank 114.

Here, a region of the side face 115*d* is a range having a top edge at point I1 and a bottom edge at a point where the protruding portion 115C has a thickness of zero (minimum point "I2", labeled "115*e*" in FIG. 4 and FIG. 5). The side face 115*d* is curved in an arc at a portion near a top edge (hereinafter, "top edge portion") J and a portion near a bottom edge (hereinafter, "bottom edge portion") K, and is nearly linear at an intermediate portion L between the top edge portion J and the bottom edge portion K.

The top edge portion J of the side face 115*d* has a curved (parabolic) shape that is upwardly convex. The bottom edge portion K of the side face 115*d* has a curved (parabolic) shape that is downwardly convex. An inflection point is found on the intermediate portion L. Notably, the length from point I2 to point I1, point I2 being a reference point in the X-axis direction, is a tail size, here labeled "a2".

The portion of the first bank 115 intersecting the second bank 114 has inclination angles θ1 and θ2 for the inclination of the side face 115*d* of the first bank 115, with reference to the top face 114*a* of the second bank 114, satisfying Math. (1) as given below.

$$\theta 1>20° \text{ and } \theta 2>20° \quad (1)$$

Figure 10:
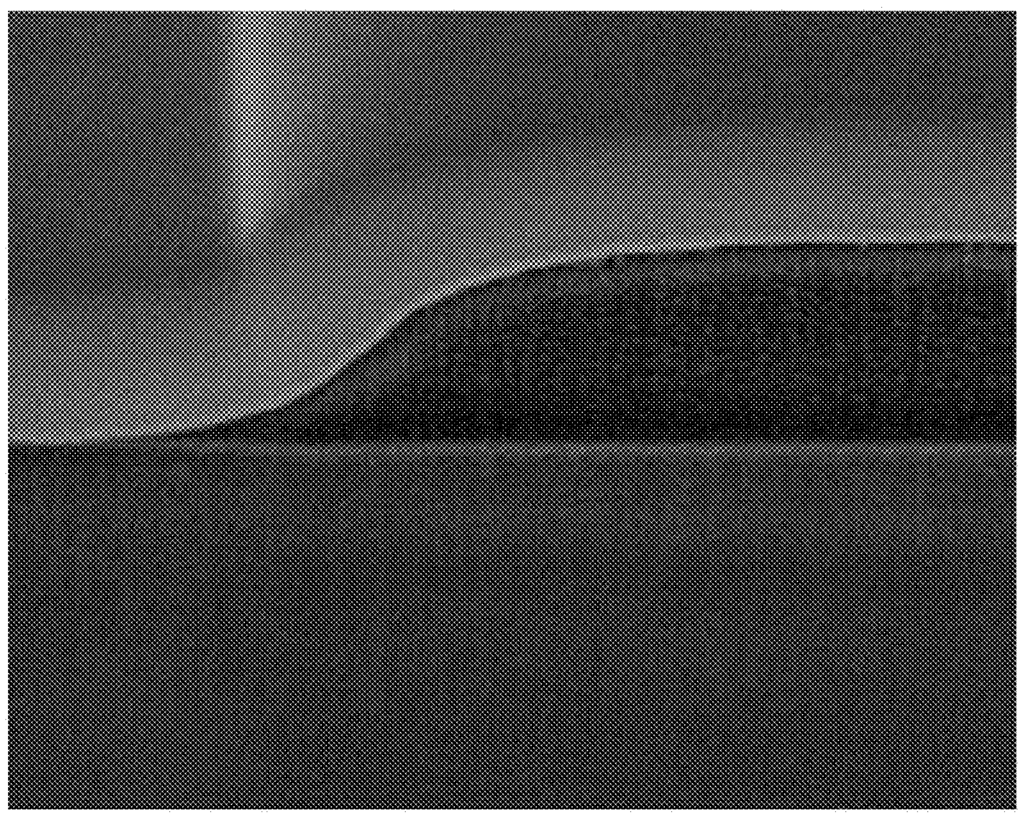
FIG. 10 is a picture depicting a lateral cross-section of the first bank.
Figure 11:
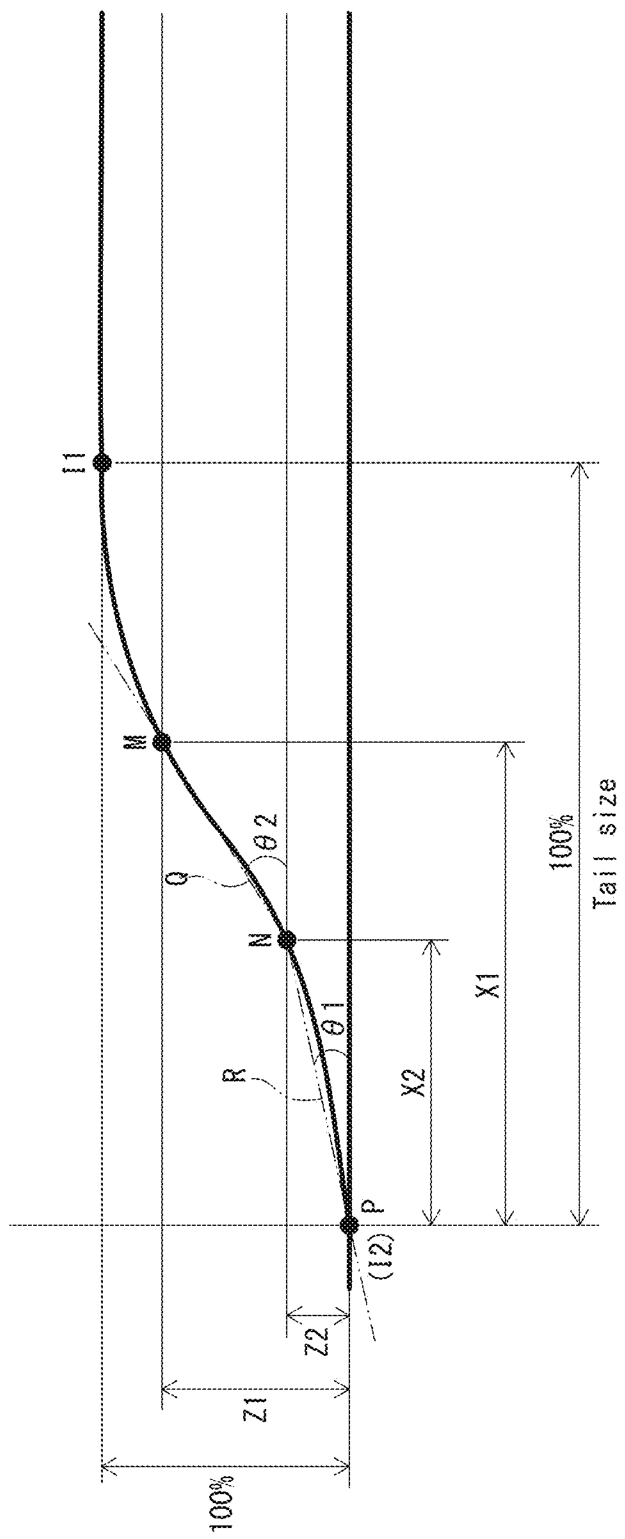
FIG. 11 is a diagram describing inclination angles $\theta 1$ and $\theta 2$ of Math. (1) based on the picture of FIG. 10.

FIG. 10 is a picture depicting a cross-section of the first bank 115. FIG. 11 is a diagram describing the inclination angles θ1 and θ2 of Math. (1) based on the picture of FIG. 10. Notably, FIG. 11 has been produced by tracing over the shape of the first bank 115 in the picture of FIG. 10.

Here, with reference to the top face 114*a* of the second bank 114, a first point ("M" in FIG. 11) is at Z1% (here, 75%) of the total height of the first bank 115, on the side face (surface) 115*d* of the first bank 115, a second point ("N" in FIG. 11) is at Z2% (here, 20%) of the total height of the first bank 115, on the side face (surface) 115*c* of the first bank 115, and a third point ("P" in FIG. 11) is at 0% of the total height of the first bank 115, on the side face (surface) 115*c* of the first bank 115.

Here, point I1, which is the maximum point on the side face 115*d*, is the point at the full height of the first bank 115, and point I2, which is the minimum point on the side face 115*d*, is the third point.

Here, in terms of the X-axis direction, taking the distance between the third point P and point I1 to be 100%, the distance between the third point P and the first point M is proportionally 60% ("X1" in FIG. 11), and the distance between the third point P and the second point N is proportionally 40% ("X2" in FIG. 11). Here, the distance in the X-axis direction is termed tail distance, and is, for example, a tail distance amount.

Inclination angle θ2 is the angle between a first virtual line Q joining the first point M and the second point N, and the top face 114*a* of the second bank 114. Inclination angle θ1 is the angle between a second virtual line R joining the second point N and the third point P, and the top face 114*a* of the second bank 114.

Also, the above-described inclination angle θ1 and the above-described inclination angle θ2 satisfy the relationship $$\theta 2>\theta 1.$$

Furthermore, inclination angle θ2 is such that $$\theta 2>45°.$$

(3) Ink Repellency

As a result of careful consideration, the inventor has discovered that with respect to the side face 115*d* of the first bank 115 positioned over the second bank 114, having the inclination angles θ1 and θ2 between a cross-sectional surface orthogonal to a direction of extension of the first bank 115 and a virtual plane (reference plane) parallel to the top face 114*a* of the second bank 114 satisfy Math. (1) as given above enables prevention of ink repellency for ink applied in the vicinity of a lower edge 115*e* of the side face 115*d* of the first bank 115, which is over the second bank 114.

Math. (1), described above in terms of the surface of the side face 115*d* of the first bank 115, was reached as a result of creating test samples having various profiles and observing ink repellency conditions.

Specifically, the inclination angles θ1 and θ2 may be changed by changing the combination of materials for the second bank 114 and the first bank 115. A total of six samples were created through such combinations, each combining one of three types of the first bank 115 and one of two types of the second bank 114, and ink repellency evaluation was performed thereon.

As a result, Math. (1) for avoiding ink repellency was discovered by comparing samples where ink repellency occurs and samples where ink repellency does not occur.

Here, satisfying Math. (1) is defined by the maximum amount (maximum value) of the tail distance X1. When the tail distance X1 is small, less of the lyophobic component from region X1 of the second bank 114 and the first bank 115 adheres to the surface of the hole injection layer 113 in the tail vicinity (i.e., the side near the second bank 114). Accordingly, satisfying Math. (1) is beneficial in terms of ink repellency 5. Other (1) First Electrode Unit (1-1) First Electrode Unit In the embodiment, an anode is employed as the first electrode. However for example, a cathode may also be employed as the first electrode. Also, in the embodiment, the first electrode unit is provided with the anode 112 and the hole injection layer 113. However, the anode may also be provided alone, and the anode may be provided alongside another functional layer, provided that at least the first electrode is included. The other functional layer may be, for example, a layer such as an oxidation prevention layer preventing oxidation of the first electrode, which is a metal layer.

Notably, when a cathode is employed as the first electrode, the first electrode unit may be provided only with the cathode, may be provided with the cathode and the electron transport layer, and may be provided with the cathode and another functional layer.

(1-2) Arrangement

In the embodiment, the first electrode units are each shaped, as seen in a plan view, to be rectangular, extending in the first direction that is an example of the Y-axis direction. However, for example, the shape may be rectangular with the short side being along the first direction, and may also be square. The first direction is orthogonal to the second direction when the first electrode unit is one of rectangular and square.

The shape of the first electrode unit in the plane may be, for example, a parallelogram such as a diamond. In such a situation, the first direction and the second direction are not orthogonal.

In the embodiment, the first electrode units are arranged with spacing in rows along the first direction and the second direction, making a grid pattern as seen in a plan view. However, the first electrode units may also be arranged in rows parallel to the first direction and with different spacing for the first electrode units between adjacent ones of the rows. In such a situation, the insulating layer serving as an example of the second bank extends in the second direction, but does not extend in a straight line along the first electrode units arranged in the second direction as described in the embodiment, instead extending in the second direction while in contact with one of the first electrode units.

(2) Insulating Layer

In the embodiment, the insulating layer is taller than the top face of the first electrode unit, as indicated in FIG. 5, for example. However, provided that it is possible to ensure insulation between neighboring first electrode units, the insulating layer may also be equal in height to the top face of the first electrode unit (that is, the two may be coplanar), and may be slightly shorter than the top face of the first electrode unit.

(3) Banks (First Bank)

The banks extend along both sides of the first electrode units in parallel to the first direction. Also, the banks are taller than the insulating layer and the first electrode unit so that ink containing organic material is accumulated between a pair of the banks neighboring each other in the second direction. This is done to keep the thickness of organic layers in the pixel units uniform.

Accordingly, there is no need for the banks to extend in correspondence with all of the first electrode units in parallel to the first direction, provided that the banks extend in correspondence with a predetermined group of the first electrode units in parallel to the first direction. In such a situation, new taller banks may also be formed to extend in the second direction between the first electrode units neighboring each other in the first direction.

(4) Light-Emitting Units

In the embodiment, the light-emitting units are provided with the hole transport layer 116, the organic light-emitting layer 117, and the electron transport layer 118. However, when the organic light-emitting layer is in a layer structure that also includes other functional layers, the other functional layers may also be made up of organic material. That is, other functional layers formed on the top face of the first electrode units, which are over the first electrode units between the first banks, may be formed using a wet printing method with ink that includes organic material. Accordingly, the light-emitting units may be layers including only the organic light-emitting layer, and may also include functional layers other than the hole transport layer described in the embodiment.

(5) Organic Light-Emitting Device

In the embodiment, the organic light-emitting device is described as a color organic light-emitting device. However, the organic light-emitting device pertaining to an aspect of the present invention may also be applied to an organic display device for a monochromatic display, for example. Furthermore, the sub-pixel structure of the display device may also be applied to a lighting device having a dimming and color adjustment function, as an example of the light-emitting device of an aspect of the present invention.

INDUSTRIAL APPLICABILITY

The present invention is applicable to the realization of an organic light-emitting panel and an organic light-emitting device having high-quality emitted light.

REFERENCE SIGNS LIST

1 Organic EL display device
10 Organic display panel
112 Anode
113 Hole injection layer
114 Second bank (Insulating layer)
115 First bank (bank)
116 Hole transport layer
117 Organic light-emitting layer
119 Cathode

The invention claimed is:

1. An organic light-emitting panel, comprising:

a substrate;

a plurality of first electrode units arranged at intervals along a first direction and a second direction over a main surface of the substrate;

an insulating layer extending in the second direction between adjacent ones of the first electrode units in the first direction over the substrate, the insulating layer being taller than the first electrode units and having a planar top face;

a plurality of banks each extending in the first direction between adjacent ones of the first electrode units in the second direction over the substrate, the banks crossing over the insulating layer at portions intersecting the insulating layer such that the banks overlap with the insulating layer in the thickness direction of the substrate, and the banks being taller than the insulating layer and the first electrode units;

a light-emitting unit disposed between adjacent ones of the banks, being continuous in the first direction and crossing over the insulating layer, and including an organic light-emitting layer made from an organic material; and a second electrode unit disposed at least above the first electrode units, in a region corresponding to the light emitting unit, wherein the insulating layer, the banks, and a bottom-most layer portion of the light-emitting unit are each made from an organic material, for each of the first electrode units, at least a top face portion thereof is made from one of a metal material and an inorganic material, for each of the banks, a portion thereof that is positioned over the insulating layer, in a cross-section orthogonal to the first direction, has a surface where an inclination angle $\theta 1$ and an inclination angle $\theta 2$, defined below, satisfy the relations:

$$\theta 1>20° \text{ and } \theta 2>20°,$$

the inclination angle $\theta 2$ being an angle between a first virtual line joining a first point and a second point, and a top face of the insulating layer, the inclination angle $\theta 1$ being an angle between a second virtual line joining the second point and a third point, and the top face of the insulating layer, the first point being on the surface of the bank at 75% of total height of the bank relative to the top face of the insulating layer, the second point being on the surface of the bank at 20% of total height of the bank relative to the top face of the insulating layer, and the third point being on the surface of the bank at 0% of total height of the bank relative to the top face of the insulating layer.

2. The organic light-emitting panel according to claim 1, wherein the banks are made from a fluorine resin material.

3. The organic light-emitting panel according to claim 1, wherein the inclination angle $\theta 1$ and the inclination angle $\theta 2$ satisfy the relation $\theta 2>\theta 1$.

4. The organic light-emitting panel according to claim 1, wherein in the cross-section of the portion of the bank positioned over the insulating layer, a profile from the first point to the second point includes an upwardly convex curved portion, and a profile from the second point to the third point includes a downwardly convex curved portion.

5. An organic light-emitting device, comprising:

an organic light-emitting panel; and a control drive circuit connected to the organic light-emitting panel, wherein the organic light-emitting panel as in claim 1 is used as the organic light-emitting panel.

6. The organic light-emitting panel according to claim 1, wherein the surfaces of the banks have greater liquid repellency than the top face of the insulating layer.

7. The organic light-emitting panel according to claim 1, wherein the banks directly contact an upper surface of the insulating layer at the intersecting portions.

8. The organic light-emitting panel according to claim 1, wherein the insulating layer extends continuously from one edge of the substrate to another edge of the substrate in the second direction.

* * * * *